United States Patent
Ogihara et al.

(10) Patent No.: US 7,332,446 B2
(45) Date of Patent: Feb. 19, 2008

(54) COMPOSITION FOR FORMING POROUS FILM, POROUS FILM AND METHOD FOR FORMING THE SAME, INTERLEVEL INSULATOR FILM AND SEMICONDUCTOR DEVICE

(75) Inventors: Tsutomu Ogihara, Niigata-ken (JP); Fujio Yagihashi, Niigata-ken (JP); Yoshitaka Hamada, Niigata-ken (JP); Takeshi Asano, Niigata-ken (JP); Motoaki Iwabuchi, Niigata-ken (JP); Hideo Nakagawa, Oumihachiman (JP); Masaru Sasago, Hirakata (JP)

(73) Assignees: Shin-Etsu Chemical Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 134 days.

(21) Appl. No.: 10/808,692

(22) Filed: Mar. 25, 2004

(65) Prior Publication Data

US 2004/0188809 A1    Sep. 30, 2004

(30) Foreign Application Priority Data

Mar. 27, 2003    (JP)    ............... 2003-087066

(51) Int. Cl.
*H01L 21/469*    (2006.01)
(52) U.S. Cl. .................... 438/783; 257/E21.273
(58) Field of Classification Search ........ 257/E21.273; 438/783
See application file for complete search history.

(56) References Cited

U.S. PATENT DOCUMENTS

| | | |
|---|---|---|
| 4,634,509 A | 1/1987 | Shimizu et al. |
| 5,494,859 A | 2/1996 | Kapoor |
| 5,707,783 A | 1/1998 | Stauffer et al. |
| 6,037,275 A | 3/2000 | Wu et al. |
| 6,197,913 B1 | 3/2001 | Zhong |
| 6,313,045 B1 | 11/2001 | Zhong et al. |
| 6,359,096 B1 | 3/2002 | Zhong et al. |
| 6,376,634 B1 | 4/2002 | Nishikawa et al. |
| 6,391,999 B1 | 5/2002 | Crivello |

(Continued)

FOREIGN PATENT DOCUMENTS

EP    1 205 438 A1    5/2002

(Continued)

OTHER PUBLICATIONS

Inagaki et al., "Synthesis of Highly Ordered Mesoporous Materials from a Layered Polysilicate," *J. Chem. Soc., Chem. Commun.*, pp. 680-682, 1993.

(Continued)

*Primary Examiner*—Asok Kumar Sarkar
(74) *Attorney, Agent, or Firm*—Alston & Bird LLP

(57) ABSTRACT

According to the invention, the thin film having the thickness controlled desirably can be easily formed using common semiconductor processes. Provided is a coating liquid for forming the porous film having an excellent dielectric property and mechanical property. Specifically, the coating liquid for forming a porous film comprises the condensation product obtained by condensation of one or more silicate compounds represented by the formula $(X_2O)_i(SiO_2)_j(H_2O)_k$ and one more organosilate compounds represented by the formula $(X_2O)_a(RSiO_{1.5})_b(H_2O)_c$. Thus, the porous insulating film having sufficient mechanical strength and dielectric properties for use in the semiconductor manufacturing process can be manufactured.

12 Claims, 1 Drawing Sheet

U.S. PATENT DOCUMENTS

| | | |
|---|---|---|
| 6,413,647 B1 | 7/2002 | Hayashi et al. |
| 6,512,071 B1 | 1/2003 | Hacker et al. |
| 6,533,855 B1 | 3/2003 | Gaynor et al. |
| 6,534,025 B1 | 3/2003 | Yano et al. |
| 6,576,568 B2 * | 6/2003 | Mandal et al. ............... 438/781 |
| 6,596,404 B1 | 7/2003 | Albaugh et al. |
| 6,632,489 B1 * | 10/2003 | Watanabe et al. ........ 428/32.34 |
| 6,639,015 B1 | 10/2003 | Nakashima et al. |
| 6,680,040 B1 * | 1/2004 | Nishida et al. ............. 423/335 |
| 6,696,538 B2 | 2/2004 | Ko et al. |
| 2001/0042440 A1 * | 11/2001 | Miyazawa et al. ............. 95/139 |
| 2002/0020327 A1 | 2/2002 | Hayashi et al. |
| 2002/0098279 A1 | 7/2002 | Lyu et al. |
| 2002/0155053 A1 * | 10/2002 | Nishiyama et al. ......... 423/335 |
| 2002/0160207 A1 | 10/2002 | Kohmura et al. |
| 2003/0064321 A1 | 4/2003 | Malik et al. |
| 2003/0091838 A1 | 5/2003 | Hayashi et al. |
| 2003/0104225 A1 | 6/2003 | Shiota et al. |
| 2003/0157311 A1 | 8/2003 | MacDougall et al. |

FOREIGN PATENT DOCUMENTS

| | | |
|---|---|---|
| EP | 1223192 A1 | 7/2002 |
| EP | 1245642 A1 | 10/2002 |
| EP | 1 123 753 A2 | 8/2003 |
| JP | 63-015355 | 4/1988 |
| JP | 05-125191 | 5/1993 |
| JP | 06-145599 | 5/1994 |
| JP | 9-194298 | 7/1997 |
| JP | 11-246665 | 9/1999 |
| JP | 2000-44875 | 2/2000 |
| JP | 2000-309751 | 11/2000 |
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |
| JP | 2001-131479 | 5/2001 |
| JP | 2001-157815 | 6/2001 |
| JP | 2001-164186 | 6/2001 |
| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-023354 | 1/2002 |
| JP | 2002-030249 A | 1/2002 |
| JP | 2002-038090 A | 2/2002 |
| WO | WO 00/12640 | 3/2000 |
| WO | WO 03/088344 | 10/2003 |

OTHER PUBLICATIONS

Burkett et al., "Synthesis Of Hybrid Inorganic-Organic Mesoporous Silica By Co-Condensation Of Siloxane And Organosiloxane Precursors," *J. Chem. Soc. Chem. Commun.*, 1996, 1367-1368.

Supplementary European Search Report for corresponding European Patent Application No. 03 81 1129 dated Dec. 8, 2005.

* cited by examiner

COMPOSITION FOR FORMING POROUS FILM, POROUS FILM AND METHOD FOR FORMING THE SAME, INTERLEVEL INSULATOR FILM AND SEMICONDUCTOR DEVICE

BACKGROUND OF THE INVENTION

1. Field of the Invention

The present invention relates to a composition for film formation which can be formed into a porous film that excels in dielectric properties, adhesion, film consistency and mechanical strength, and has reduced moisture absorption; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a smaller and faster semiconductor device with reduced power consumption.

In an attempt to reduce the resistance of metal interconnections, in recent years, metallic copper interconnections have been employed more than conventional aluminum interconnections in the structure of a device. However, use of this structure alone has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film which has been used conventionally. A porous film can be said to be the only practical film as a material with a relative permittivity of 2.0 or less, and various methods for forming a porous film have been proposed.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As a second method for forming a porous film, it is well known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

As a third method for forming a porous film, it is well known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation which is characterized by containing a compound having (A) a component expressed by $(R')_n Si(OR'')_{4-n}$ (R' and R'' are univalent organic radicals, and m is an integer of 0 to 2); (B) a metal chelate compound; and (C) a compound having a polyalkylene oxide structure.

However, these methods have respective major drawbacks as follows.

In the first method for forming a porous film, the synthesis of the precursor solution of the siloxane polymer increases the cost. In addition, the formation of the coating film by coating the precursor solution increases the amount of silanol groups remaining in the coating film, which causes a degassing phenomenon indicating the evaporation of water and the like in the heat treatment process that is conducted later and which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores which must be silanized because otherwise hygroscopicity is high so that the film quality decreases. The silanization makes the process more complicated. In the case where a wet gel is formed by the CVD process, it is necessary to use a special type of CVD device which is different from the plasma CVD device generally used in the semiconductor process, thereby also increasing the cost.

In the third method for forming a porous film, the diameter of the micro-pores formed between the silica micro-particles, which is determined by the accumulation structure of the silica micro-particles that are accumulated geometrically, becomes very large. This makes it difficult to set the relative permittivity of the porous film to 2 or below.

In the case of the fourth method, out of the three components (A), (B), and (C), the metal chelate compound of (B) is essential to increase the compatibility of the components (A) and (C), and to make the thickness of the coating film uniform after being hardened. However, it is not preferable because it makes the manufacturing process complicated and increases the cost. Therefore, it is desired to develop a material which enables a homogeneous solution to be formed without a chelate component and the coating film to be flat after being hardened.

In comparison to the conventional method for forming a porous film, it has been found that a porous member having a channel structure of mesopore size (micro-pores with diameters of 2 to 50 nm) can be formed as follows: alumino silicate, silica, or the like is condensed while using a micelle made from a surface active agent as a mold so as to form the structure, and then the surface active agent component is removed by sintering or solvent extraction. For example, Inagaki et al. propose making polysilicates react in water while using a surface active agent as a mold (J. Chem. Soc. Chem. Commun., p. 680, 1993). Furthermore, Japanese Patent Provisional Publication No. 9-194298 discloses that tetraalkoxysilane is reacted in acid conditions in water while using a surface active agent as a mold, and is applied onto the substrate so as to form a silica porous film having micro-pores of diameters of 1 to 2 nm.

However, these methods have problems as follows. In the first method, the powdered porous member can be easily formed, but it is impossible to form a porous film as a thin film on the substrate which is used for the fabrication of semiconductor devices. In the second method, a porous member can be formed into a thin film, but it is impossible to control the orientation of micro-pores, and it is also impossible to form a uniform thin film in a wide area.

Japanese Patent Provisional Publication No. 2001-130911 discloses a method for forming a silica mesoporous thin film by using a mixture of an acid hydrolysis condensate of a silicon alkoxide and a surface active agent after adjusting the mixture to pH3 or below for stabilization.

However, in this method, too, the restriction of the solute concentration makes it difficult to properly control the thickness of a coating film, thereby making it difficult to apply it to a practical semiconductor fabrication process. When this solution is diluted with water, the thickness of the coating film becomes controllable, but the speed of polycondensation of the silica component increases to lose stability of the coating solution.

On the other hand, Japanese Patent Provisional Publication Nos. 2001-115029 and 2001-203197 show that a coating solution excellent in dielectric properties is prepared by hydrolysis and condensation of a silane compound. Because it is considered that a coefficient of elasticity must be 5 GPa or higher for use in an actual semiconductor fabrication process, these inventions cannot be said to be satisfactory for mechanical strength.

As mentioned above, the conventional materials have several problems such as deterioration of the film quality during the heat treatment step and high cost. Moreover, when the porous film is formed, there is a problem of poor coating performance. Further, when the conventional porous film is incorporated into the multi-level interconnects of the semiconductor device as an insulator film, the mechanical strength necessary for the semiconductor device is not obtained at this stage.

Thus, when the dielectric constant of the porous film used as an insulator film in the multi-level interconnects of the semiconductor device is too high, the RC delay in the multi-level interconnects of the semiconductor device is increased so that the performance of the semiconductor device (high speed and low power consumption) cannot be improved. This represents a large problem. Furthermore, a porous film with a low mechanical strength deteriorates the reliability of the semiconductor device.

SUMMARY OF THE INVENTION

Looking at the problems described above, the purpose of the invention is to provide a coating liquid for forming a porous film which has superb mechanical strength and excellent dielectric properties. The coating liquid can easily provide a thin film having the desirably controlled film thickness using conventional methods of semiconductor processing. The invention has another object of providing a high-performing and highly reliable semiconductor device which contains the porous film inside.

The inventors studied keenly, aiming for the development of a coating liquid for forming the porous film. Then, they reached the composition and the method for forming the porous film which has sufficient mechanical strength and dielectric properties to be used in the semiconductor manufacturing process, using condensation of a specific silicate compound in the presence of acid. Thus, they attained the invention.

Up to now, in the most of the manufacturing field of low dielectric constant insulator films, low dielectric constant insulator films are manufactured by the method where raw material of an alkoxysilane compound or a halogenated silane compound is subjected to hydrolysis and condensation in the presence of an acid or base catalyst.

However, when a conventional silane compound or a halogenated silane compound is used as a raw material, a large amount of acid generated during the hydrolysis makes pH control in a reacting solution very difficult. Since the product is obtained only in a limited condition, it is difficult to obtain the product having the desirable properties. Moreover, when the alkoxysilane compound is used as a starting material, it is easier to control the reaction than when the halogenated silane compound is. However, the alkoxysilane compound brings the following problems. It is well-known that the silanol group, generated by hydrolysis in Equation 1, is subjected to condensations with another silanol group in Equation 2, and with an alkoxy group in Equation 3, as well as with an alkoxy group of an unhydrolyzed alkoxysilane monomer in Expression 4.

$$SiOR + H_2O \rightarrow SiOH + ROH \qquad \text{(Equation 1)}$$

$$SiOH + HOSi \rightarrow SiOSi + H_2O \qquad \text{(Equation 2)}$$

$$SiOH + ROSi \rightarrow SiOSi + ROH \qquad \text{(Equation 3)}$$

$$SiOH + ROSi(OR)_3 \rightarrow SiOSi(OR)_3 + ROH \qquad \text{(Equation 4)}$$

$$SiOR + ROSi \rightarrow \text{does not react} \qquad \text{(Equation 5)}$$

Especially in the presence of base, the above reactions progress competitively. When the reaction of Equation 4 progresses, an alkoxy group could be incorporated into a condensation molecule. When this type of reaction takes place even to a small degree, the alkoxy group would remain in the molecule so that a defect in the three dimensional network of siloxane linkages is generated at the point of the alkoxy group. The alkoxy groups can thermally react with a silanol group to form a siloxane linkage in Equation 3 so that the strength of the coated film can be improved. However, when the silanol group does not exist near the alkoxy group, the siloxane linkage is not formed in Equation 5 so that the strength of the coated film decreases. Thus, when the alkoxysilane compound is used as a staring material, it is not likely to yield a low dielectric constant insulating film with the desired physical properties.

Accordingly, neither the halogenated silane compound nor the alkoxysilane compound is used in the invention. Instead, an organosilicate compound and/or a silicate compound is added to form a condensation product. It is found that by using the coating liquid containing the condensation product, a low dielectric constant insulating film with excellent physical properties can be obtained. Thus, the invention is attained.

When acid HY is added to silicate solution, the silicate compound is converted into silicic acid in Equation 6.

$$SiOX + HY \rightarrow SiOH + XY \qquad \text{(Equation 6)}$$

$$SiOH + HOSi \rightarrow SiOSi + H_2O \qquad \text{(Equation 7)}$$

When the acid is further added to lower the pH value, Silicic acid is condensed to yield a condensation product in Equation 7. The product does not have the alkoxy group in the molecule, being different from the condensation product of a silane compound as a starting material. Hence, structural defects caused by the alkoxy group in Equation 5 do not appear. Consequently, it is found to have the effect of improving the mechanical strength of the entire coating film.

According to the invention, provided is a composition for forming a porous film comprising a condensation product and an organic solvent wherein the condensation product is obtained by condensation, in the presence of acid, of at least one compound selected from the group consisting of silicate represented by formula (1) and organosilicate represented by formula (2)

$$(X_2O)_i(SiO_2)_j(H_2O)_k \quad (1)$$

$$(X_2O)_a(RSiO_{1.5})_b(H_2O)_c \quad (2)$$

wherein X independently represents Li, Na, K, Rb, Cs or quaternary ammonium; i, j and k independently represent numbers which satisfy $0<i\leq1$, $0j\leq1$ and $0\leq k\leq2$; R independently represents a hydrogen atom or an organic group; and a, b and c independently represent numbers which satisfy $0<a\leq1$ and $0<b\leq1$ and $0\leq c\leq1.5$.

According to the invention, provided is a method for manufacturing a porous film comprising steps of applying said composition to a substrate so as to form a film thereon, drying the film and heating the dried film so as to harden the film. A porous film formable by said composition is also provided. It can be suitable for a semiconductor process, providing an interlevel (or interlayer) insulating film which excels in dielectric and mechanical properties.

The semiconductor device of the invention comprises a porous film therein, the porous film being formed by a composition comprising a condensation product and an organic solvent wherein the condensation product is obtained by condensation, in the presence of acid, of at least one compound selected from the group consisting of silicate represented by formula (1) and organosilicate represented by formula (2)

$$(X_2O)_i(SiO_2)_j(H_2O)_k \quad (1)$$

$$(X_2O)_a(RSiO_{1.5})_b(H_2O)_c \quad (2)$$

wherein X independently represents Li, Na, K, Rb, Cs or quaternary ammonium; i, j and k independently represent numbers which satisfy $0<i\leq1$, $0j\leq1$ and $0\leq k\leq2$; R independently represents a hydrogen atom or an organic group; and a, b and c independently represent numbers which satisfy $0<a\leq1$ and $0<b\leq1$ and $0\leq c\leq1.5$. More specifically, said porous film may be used as an insulating film in multi-level interconnects of semiconductor devices.

Thus, the mechanical strength of the semiconductor device is secured. Furthermore, the hygroscopic property of the porous film is decreased, and the semiconductor device with a built-in insulator film that has a low dielectric constant is achieved. Because of the decreasing dielectric constant of the insulator film, the parasitic capacitance of the area around the multi-level interconnects is decreased, leading to the high-speed operation and low power consumption of the semiconductor device.

Moreover, it is preferable for the semiconductor device of the invention that a porous film is between metal interconnections in a same layer of multil-level interconnects or between upper and lower metal interconnection layers. This arrangement can achieve a high-performing and highly reliable semiconductor device.

The composition for forming a porous film of the present invention facilitates the formation of a porous film having a properly controlled thickness. This porous film has a low dielectric constant, and excels in adhesion, film uniformity and mechanical strength. In addition, when the porous film made from the composition of the present invention is used as the insulator film of the multi-level interconnects, a high-performing and highly reliable semiconductor device can be provided.

DETAILED DESCRIPTION OF THE PREFERRED EMBODIMENTS

Figure 1:
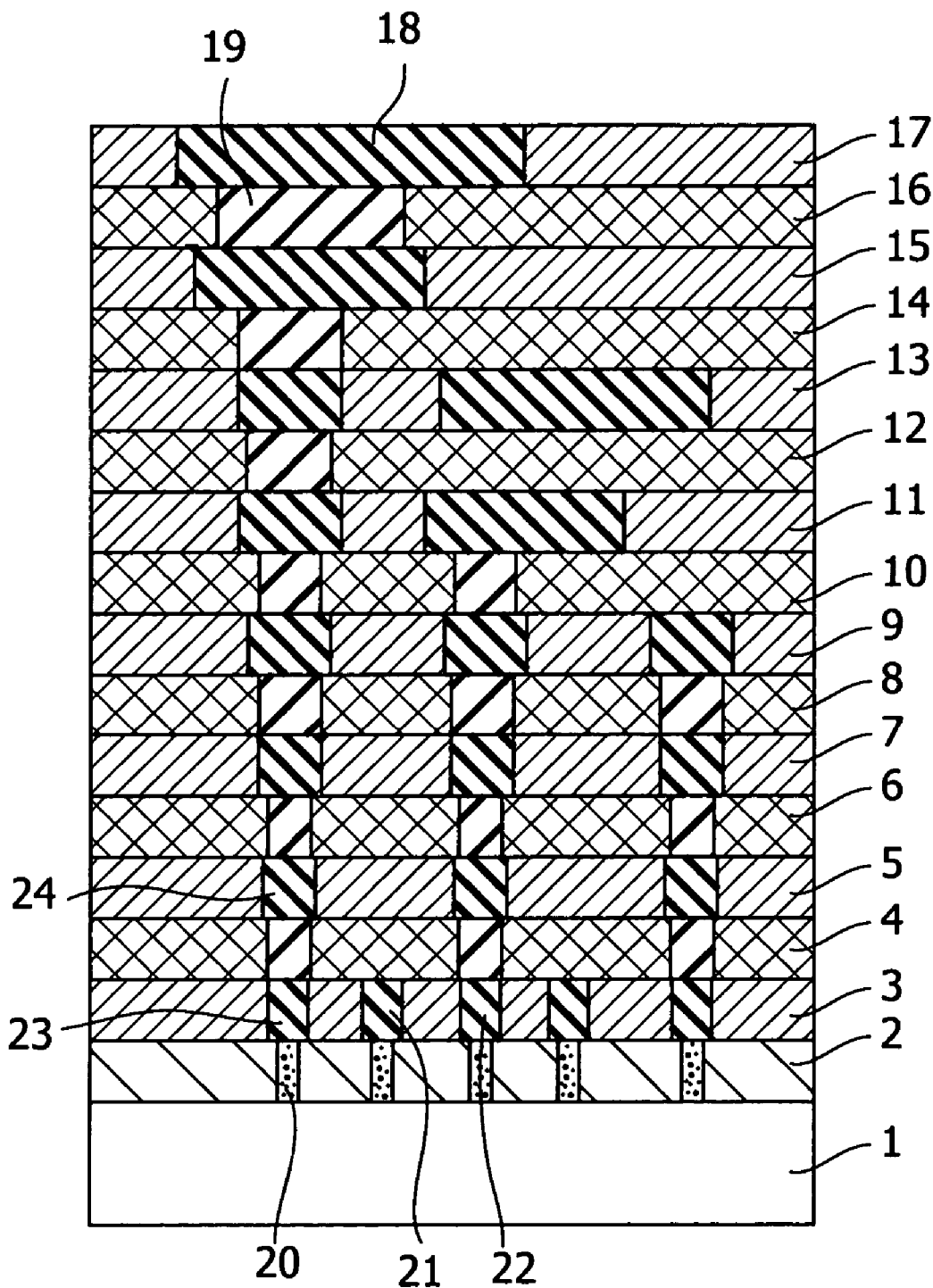
FIG. 1 is a schematic cross-sectional view for an example of the semiconductor device in the invention.

A silicate compound represented by the formula (1) used in the invention may preferably include, but are not limited to, silicates such as lithium silicate, sodium silicate, potassium silicate, rubidium silicate, cesium silicate and tetramethylammonium silicate; and sodium metasilicates. Tetramethylammonium silicate may be more preferable. These compounds can be obtained from silicon source and alkali. The silicon source may include silica such as quarts sand and Cabosil (manufactured by Cabott Co.), and a silane compound having four hydrolyzable groups. However, the methods for obtaining the silicate compounds are not limited to the above.

The silane compound having with four hydrolyzable groups may include, but are not limited to, tetrahalosilane such as tetrafluorosilane, tetrachlorosilane and tetrabromosilane; and tetraalkoxysilane such as tetramethoxysilane, tetraethoxysilane, tetrapropoxysilane, tetrabutoxysilane and tetraamyloxysilane. Moreover, alkali may include, but are not limited to, alkali metal carbonate such as lithium carbonate, sodium carbonate, potassium carbonate, rubidium carbonate and cesium carbonate; alkali metal hydroxide such as lithium hydroxide, sodium hydroxide, potassium hydroxide, rubidium hydroxide and cesium hydroxide; quaternary ammonium hydroxide such as tetramethylammonium hydroxide, tetraethylammonium hydroxide, choline, tetrapropylammonium hydroxide and tetrabutylammonium hydroxide.

The composition of silicate compound (1) is variable depending on the silicon source, the alkali and the residual moisture. Examples include i=1, j=1 and k=0 for sodium silicate; I=1/9, j=1/9 and k=1 for metasilicate; and i=0.25, j=1 and k=0.25 for tetramethylammonium silicate. However, the invention is not limited to the these examples.

On the other hand, the organosilicate compound represented by the formula (2) used in the invention may preferably include lithium methlylsilicate, lithium tehylsilicate, lithium propylsilicate, lithium butylsilicate, lithium amylsilicate, lithium hexylsilicate, lithium 2-ethylhexysilicate, lithium vinylsilicate, lithium phenylsilicate, sodium methylsilicate, sodium ethylsilicate, sodium propylsilicate, sodium butylsilicate and sodium amylsilicate, sodium hexylsilicate, sodium 2-ethylhexylsilicate, sodium vinylsilicate, sodium phenylsilicate, potassium methylsilicate, potassium ethylsilicate, potassium propylsilicate, potassium butylsilicate, potassium amylsilicate, potassium hexylsilicate, potassium 2-ethylhexylsilicate, potassium vinylsilicate, potassium phenylsilicate, rubidium methylsilicate, rubidium ethylsilicate, rubidium propylsilicate, rubidium butylsilicate, rubidium amylsilicate, rubidium hexylsilicate, rubidium 2-ethylhexylsilicate, rubidium vinylsilicate, rubidium phenylsilicate, cesium methylsilicate, cesium ethylsilicate, cesium propylsilicate, cesium butylsilicate, cesium amylsilicate, cesium hexylsilicate, cesium 2-ethylhexylsilicate, cesium vinylsilicate, and cesium phenylsilicate, tetramethylammonium methylsilicate, tetramethylammonium ethylsilicate, tetramethylammonium propylsilicate, tetramethylammonium butylsilicate, tetramethylammonium amylsilicate, tetramethylammonium hexylsilicate, tetramethylammonium 2-ethylhexylsilicate, tetramethylammonium vinylsilicate and p tetramethylammonium henylsilicate. The tetramethylammonium methylsilicate may be more preferable. They may be obtained from the silane compound having three hydrolyzable groups and alkali. However, the method for producing them is not limited to this method.

The silane compound having three hydrolyzable groups may include, but are not limited to, methyltrifluorosilane, methyltrichlorosilane, methyltribromosilane, methyltrimethoxysilane, methyltriethoxysilane, methyltripropoxysilane, methyltributoxysilane, methyltriamyloxysilane, methyltriphenoxysilane, ethyltrifluorosilane, ethyltrichlorosilane, ethyltribromosilane, ethyltrimethoxysilane, ethyltriethoxysilane, ethyltripropoxysilane, ethyltributoxysilane, ethyltriamyloxysilane, ethyltriphenoxysilane, propyltrifluorosilane, and propyltrichlorosilane, propyltribromosilane, propyltrimethoxysilane, propyltriethoxysilane, propyltripropoxysilane, propyltributoxysilane, propyltriamyloxysilane, propyltriphenoxysilane, butyltrifluorosilane, butyltrichlorosilane, butyltribromosilane, butyltrimethoxysilane, butyltriethoxysilane, butyltripropoxysilane, butyltributoxysilane, butyltriamyloxysilane, butyltriphenoxysilane, amyltrifluorosilane, amyltrichlorosilane, amyltribromosilane, amyltrimethoxysilane, amyltriethoxysilane, amyltripropoxysilane, amyltributoxysilane, amyltriamyloxysilane, amyltriphenoxysilane, hexyltrifluorosilane, hexyltrichlorosilane, hexyltribromosilane, hexyltrimethoxysilane, hexyltriethoxysilane, hexyltripropoxysilane, hexyltributoxysilane, hexyltriamyloxysilane, hexyltriphenoxysilane, 2-ethylhexyltrifluorosilane, 2-ethylhexyltrichlorosilane, 2-ethylhexyltribromosilane, 2-ethylhexyltrimethoxysilane, 2-ethylhexyltriethoxysilane, 2-ethylhexyltripropoxysilane, 2-ethylhexyltributoxysilane, 2-ethylhexyltriamyloxysilane, 2-ethylhexyltriphenoxysilane, vinyltrifluorosilane, vinyltrichlorosilane, vinyltribromosilane, vinyltrimethoxysilane, vinyltriethoxysilane, vinyltripropoxysilane, vinyltributoxysilane, vinyltriamyloxysilane, vinyltriphenoxysilane, phenyltrifluorosilane, phenyltrichlorosilane, phenyltribromosilane, phenyltrimethoxysilane, phenyltriethoxysilane, phenyltripropoxysilane, phenyltributoxysilane, phenyltriamyloxysilane and phenyltriphenoxysilane. Moreover, the alkali may include, but are not limited to, alkali metal carbonate such as lithium carbonate, sodium carbonate, potassium carbonate, rubidium carbonate and cesium carbonate; alkali metal hydroxide such as lithium hydroxide, sodium hydroxide, potassium hydroxide, rubidium hydroxide and cesium hydroxide; quaternary ammonium hydroxide such as tetramethylammonium hydroxide, tetraethylammonium hydroxie, choline, tetrapropylammonium hydroxide, tetrabutylammonium hydroxide, triethylmethylammonium hydroxide, methyltripropylammonium hydroxide and tributylmethylammonium hydroxide.

The composition of organosilicate compound (2) is variable depending on the silane compound, the alkali and the residual moisture. Examples include X=Na, R=CH3, a=1, b=0.5, c=1 for sodium methylsilicate; and X=(CH3)4N, R=CH3, a=1, b=0.5 and c=1 for tetramethylammonium methylsilicate.

The acid represented by the formula HY may include inorganic acid such as fluoric acid, hydrochloric acid, sulfuric acid, nitric acid and perchloric acid; sulfonic acid such as methanesulfonic acid, benzenesulfonic acid, p-toluenesulfonic acid and trifluoromethanesulfonic acid; organic acid such as formic acid, acetic acid, propionic acid, oxalic acid, malonic acid, fumaric acid, malenic acid, tartaric acid, citric acid, malic acid, benzoic acid, phthalic acid, isophthalic acid, terephthalic acid and trifluoroacetic acid; and phosphoric acid. In addition, the proton type cation exchange resin may be used.

The acid may be added 0.01 to 1000 times, preferably 0.1 to 100 (in moles) as much as that of the raw material of the silicate compound and/or the organosilicate compound.

According to the invention, for example, the solution of the organosilicate compound and/or the silicate is prepared, then the required amount of acid is added thereto, and the resulting mixture is treated at a predetermined temperature for a predetermined time to yield a condensation product. The salt obtained by neutralization as by-product can be removed from the condensation product using a common method such as filtration, ultra-filtration (UF), washing in water and ion exchange. When using a cation exchange resin exchanged with a proton as an acid, the cation exchange resin which has neutralized the alkali component can be removed with an easy filtration operation. Consequently, the process can be simplified. A solvent for coating is added to the condensation product from which the salt obtained by neutralization has been removed. Then, water and the organic solvent used in the reaction are removed by distillation under reduced pressure so that the desired coating liquid can be obtained The organic solvent can be optionally added. The properties of the obtained condensation product can be changed depending on reaction temperature, the amount of water added, types of organic solvents used in the reaction, concentrations and types of the silicate compound and the organosilicate compound as the raw material, and a type of the added acid.

The solvent used for this condensation reaction may include, but are not limited to, water, methanol, ethanol, isopropyl alcohol, butanol, propylene glycol monomethyl ether, propylene glycol monopropyl ether, propylene glycol monopropyl ether acetate, ethyl lactate and cyclohexanone. The solvent may used singly or as a mixture of two or more of solvents. The solvent may be added in a preferable amount of 0.1 to 500 times by weight as much as the weight of the silicate and/or organosilicate compound. The amount of the solvent may be more preferably 1 to 100 times by weight as much as the weight of the compound.

The solvent by which the solvent of the condensation product solution is replaced so as to prepare the coating liquid may include aliphatic hydrocarbon solvent such as n-pentane, isopentane, n-hexane, isohexane, n-heptane, 2,2,4-trimethylpentane, n-octane, isooctane, cyclohexane and methylcyclohexane; aromatic hydrocarbon solvent such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amylnaphthalene; ketone solvent such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonylacetone, diacetone alcohol, acetophenone and fenthion; ether solvent such as ethyl ether, isopropyl ether, n-butyl ether, n-hexyl ether, 2-ethyl hexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropylether, propylene glycol monobutyl ether, dipropylene glycol dimethyl ether, dipropylene glycol diethyl ether, dipropylene glycol dipropyl ether and dipropyleneglycoldibutylether; ester solvent such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol monon-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvent such as N-methylformamide, N,N-dimethylformamide, acetamide, N-methylformamide, N,N-dimethylacetamide, N-methylpropionamido, and N-methylpyrrolidone; sulfurcontaining solvent such as dimethyl sulfide, diethyl sulfide, thiophene, tetrahydrothiophene, dimethylsulfoxide, sulfolane, and 1,3-propanesultone. The solvent may be used singly or as a mixture of two or more solvents.

The reaction temperature of the condensation may be usually 0° C. to the boiling point of the solvent used for the condensation reaction. The reaction temperature may be preferable from room temperature to 100° C. The reaction time is not particularly limited, but may be commonly 10 minutes to 30 hours, more preferably 30 minutes to 10 hours. The preferable weight-average molecular weight of the obtained condensation product may be 10,000 to 1,000,000, wherein the molecular weight is based on polyethylene with Gel Permeation Chromatography (GPC).

If the condensation product obtained is shown by a rational formula, it may be almost same as siloxane polymer. However, intramolecular condensation is in fact very different from the siloxane polymer. Since there are no alkoxy groups in the solution of the condensation product of the silicate compound, an intramolecular or intermolecular dehydration-condensation reaction during the sintering can take place in the coated film obtained from the solution more easily than in the coated film obtained from the silane compound. Consequently, the condensation product of the silicate compound will be into a mechanically stronger polymer structure.

A film having a desirable thickness can be formed by spin-coating the solution containing a controlled concentration of the composition with an appropriate number of spin rotations. For example, the actual thickness of the thin film may be about 0.2 to 1 μm, but not limited to this range. For example, by applying the coating solution several times, the thickness of the film can be increased. The solvent used for dilution may include the same solvent as said solvent used for the replacement so as to prepare a coating liquid. The solvent may be used singly or as mixture of two or more solvents. Although the degree of dilution may depend on the viscosity and intended film thickness, 50 to 99 wt %, preferably 75 to 95 wt % solvent may be contained in the diluted solution.

The film thus prepared may be heated preferably for several minutes at 50° C. to 150° C. in a drying step (generally called a pre-bake in the semiconductor process) so as to remove the solvent. The heating step for hardening the coating film follows the drying step. In the heating step, the coated film may be heated to preferably 150 to 500° C., more preferably 200 to 400° C. The heating time may be preferably 1 to 300 minutes, more preferably 1 to 100 minutes.

The obtained film has high mechanical strength in the entire film. Measured with the nanoindentation, hardness is commonly 1 to 10 GPa and modulus of elasticity is commonly 5 to 50 GPa. This indicates that the obtained film has much higher mechanical strength than the porous material produced by adding a thermally decomposable polymer to silicone resin and thermally removing the polymer so as to form pores. It is because the material has hardness of 0.05 to 2 GPa and modulus of 1.0 to 4.0 GPa.

The porous film of the invention may be particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections. When an interlevel insulator film is prepared by using the composition for forming a porous film of the present invention, the semiconductor device can be downsized and faster and consume less power.

There is a conventional problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby making it possible to fabricate a high-speed, highly reliable and downsized semiconductor device.

The embodiments of the semiconductor device of the present invention will be described below. FIG. 1 shows a schematic cross-sectional view of an example of the semiconductor device of the invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multi-level interconnects generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the interlevel capacitance between the upper and lower metal interconnections.

Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multi-level interconnects are formed by stacking porous films. As a result, the semiconductor device can perform high-speed and low-power operations.

The porous film of the present invention enables a semiconductor device to have higher mechanical strength by its high mechanical strength, thereby greatly improving the yield of the fabrication and the reliability of the semiconductor device.

The present invention will be explained specifically through the following examples, but is not limited to them.

EXAMPLE 1

Fifty grams of tetramethoxy silane was added to 360 g of an aqueous 25 wt % solution of tetramethylammonium, and then stirred for 3 hours at 60° C. The obtained solution was concentrated up to 200 g with a rotary evaporator so that the aqueous solution of tetramethylammonium silicate was obtained.

Next, 45 g of methyltrimethoxysilane was added to 360 g of an aqueous 25 wt % solution of tetramethylammonium, and the stirred for 3 hours at 60° C. The obtained solution was concentrated up to 200 g with a rotary evaporator so that the aqueous solution of tetramethylammonium methylsilicate was obtained.

These solutions were mixed and 500 g of ethanol was added thereto. Then, the resulting mixture was kept at 55° C., while 1000 g of 10% sulfuric acid was added thereto over five hours. Then, the mixture was kept at the temperature for further 5 hours. Five hundreds grams of propylene glycol monopropyl ether was added to the obtained solution and concentrated with a rotary evaporator at 50° C. until the concentrated reached 500 g. Four hundred grams of ethyl acetate and 400 g of extra-pure water were added to this concentrate, stirred thoroughly, left still and separated to obtain an organic phase containing the condensation product. The organic phase was concentrated up to 400 g again with a rotary evaporator at 50° C. to obtain the coating liquid.

A spin coater was used to apply the liquid on an eight-inch wafer by rotation of 1500 rpm for 1 minute to form the coated film. The film was heated for 2 minutes at 120° C. on a hot plate to yield the film having thickness of 8,000 Å. After the film was heated for 3 minutes at 250° C., the film was heated for 1 hour at 450° C. under a nitrogen atmosphere in a clean oven. The film thickness at this time was 7,200 Å. The film had the dielectric constant of 2.2 and modulus of elasticity of 5.1 GPa.

The dielectric constant was obtained by a CV method using an automatic mercury grobe wherein the automatic mercury CV measurement device 495-CV system (manufactured by Japan SSM Company) was used. The modulus elasticity was obtained with Nano Indenter (manufactured by the Nano Instruments Company).

EXAMPLE 2

The coating liquid was obtained in the same manner as Example 1 except using an aqueous 15 wt % solution of potassium hydroxide was used in the place of the aqueous 25 wt % solution of tetramethylammonium. The coated film was obtained in the same manner as Example 1. The film had dielectric constant of 2.1 and modulus of elasticity of 4.5 GPa.

EXAMPLE 3

The 45 g of methyltrimethoxysilane was added to 360 g of an aqueous 25 wt % solution of tetramethylammonium solution and stirred for 3 hours at 60° C. The obtained solution was concentrated up to 200 g with a rotary evaporator to yield a slution of tetramethylammonium methylsilicate. Four hundreds grams of an aqueous 10 wt % solution of sodium silicate and 800 g of ethanol were added thereto. The resulting mixture was kept at 55° C., while 750 g of aqueous 10 wt % solution of hydrochloric acid was added thereto over 4 hours. The resulting mixture was kept at the temperature for further 5 hours. Five hundred grams of propylene glycol monopropyl ether was added thereto and was concentrated to 500 g with a rotary evaporator at 50° C. Four hundred grams of ethyl acetate and 400 g of extra-pure water were added to the concentrate, mixed thoroughly, left still and separated to yield an organic phase containing the condensation product. This organic phase was again concentrated up to 400 g with a rotary evaporator at 50° C. so as to obtain the desired coating liquid. The coated film was obtained in the same manner as in Example 1. The film had dielectric constant of 2.2 and modulus of elasticity of 5.5 GPa.

EXAMPLE 4

Four hundred grams of an aqueous 10 wt % solution of sodium silicate, 760 g of an aqueous 5 wt % solution of sodium methylsiliconate (manufactured by Osaki Industry Company), and 1200 g of ethanol were mixed. The mixture was kept at 55° C., while 600 g of an aqueous 20 wt % solution of maleic acid was added thereto over 3 hours. The mixture was kept at the same temperature for further 5 hours. Five hundred grams of propylene glycol monopropyl ether was then added thereto and was concentrated until the concentrate reached 500 g with a rotary evaporator at 50° C. Four hundred grams of ethyl acetate and 400 g of extra-pure water were added thereto, mixed thoroughly, left still, and separated to yield the organic phase containing the condensation product. The organic layer was concentrated up to 400 g with a rotary evaporator at 50° C. so that the desired coating liquid was obtained. The coating film was obtained in the same manner as Example 1. The film had dielectric constant of 2.3 and modulus of elasticity of 6.5 GPa.

COMPARATIVE EXAMPLE 1

A mixture of 60 g of tetraethoxysilane and 30 g of methytrimethoxysilane were added to a mixture of 10 g of an aqueous 40% solution of methylamine, 640 g of extra-pure water and 1200 g of ethanol, and stirred for 4 hours at 75° C. Three hundred grams of propyleneglycolmonopropylether was added to the resulting solution at 25° C. and was stirred for 1 hour. The reaction mixture was concentrated under vacuum at 40° C. to yield 300 g of coating liquid. The coated film was obtained in the same manner as Example 1. The film had dielectric constant of 2.4 and modulus of elasticity of 3.0 GPa.

The results of Examples 1 to 4 and Comparative Example 1 are shown in Table 1.

TABLE 1

| | silicate compound | organosilicate compound | dielectric constant | modulus (GPa) |
|---|---|---|---|---|
| Example 1 | tetramethylammonium silicate | tetramethylammonium methylsilicate | 2.2 | 5.1 |
| Example 2 | potassium silicate | tetramethylammonium methylsilicate | 2.1 | 4.5 |
| Example 3 | sodium silicate | tetramethylammonium methylsilicate | 2.2 | 5.5 |
| Example 4 | sodium silicate | sodium methylsiliconate | 2.3 | 6.5 |
| Comparative Example 1 | — | — | 2.4 | 3.0 |

The invention claimed is:

1. A composition for forming a porous film comprising a condensation product and an organic solvent wherein the condensation product is obtained by adding acid to at least one organosilicate represented by formula (2)

$$(X_2O)_a(RSiO_{1.5})_b(H_2O)_c \qquad (2)$$

wherein X independently represents Li, Na, K, Rb, Cs or quaternary ammonium; R independently represents a hydrogen atom or an organic group; and a, b and c independently represent numbers which satisfy $0<a\leqq 1$ and $0<b\leqq 1$ and $0\leqq c\leqq 1.5$.

2. The composition for forming a porous film according to claim 1 wherein said quaternary ammonium comprises an alkyl group having 1 to 20 carbons.

3. The composition for forming a porous film according to claim 1 wherein said R represents an organic group having 1 to 10 carbons.

4. The composition for forming a porous film according to claim 1 wherein said organosilicate represented by formula (2) is tetramethylammonium methylsilicate.

5. A method for manufacturing a porous film comprising steps of applying a composition according to claim 1 to a substrate so as to form a film thereon, drying the film and heating the dried film so as to harden the film.

6. The composition for forming a porous film according to claim 1, wherein the composition is capable of forming a porous film having a modulus of elasticity of 5 to 50 GPa.

7. The composition for forming a porous film according to claim 1, wherein the composition is capable of forming a porous film having a dielectric constant of 2.3 or less.

8. The composition for forming a porous film according to claim 1 wherein said condensation product is obtained by adding acid to said organosilicate and at least one silicate represented by formula (1)

$$(X_2O)_i(SiO_2)_j(H_2O)_k \qquad (1)$$

wherein X independently represents Li, Na, K, Rb, Cs or quaternary ammonium and i, j and k independently represent numbers which satisfy $0<i\leqq 1$, $0<j\leqq 1$ and $0\leqq k\leqq 2$.

9. A composition for forming a porous film comprising a condensation product and an organic solvent wherein the condensation product is obtained by adding acid to at least one organosilicate represented by formula (2)

$$(X_2O)_a(RSiO_{1.5})_b(H_2O)_c \qquad (2)$$

wherein X independently represents Li, Na, K, Rb, Cs or quaternary ammonium; R independently represents a hydrogen atom or an organic group; and a, b and c independently represent numbers which satisfy $0<a\leqq 1$ and $0<b\leqq 1$ and $0\leqq c\leqq 1.5$, and wherein the condensation product and the organic solvent are in the form of a coating liquid that is capable of being applied as a film with a spin coater.

10. The composition for forming a porous film according to claim 8, wherein said silicate is tetramethylammonium silicate.

11. The composition for forming a porous film according to claim 9 wherein said condensation product is obtained by adding acid to said organosilicate and at least one silicate represented by formula (1)

$$(X_2O)_i(SiO_2)_j(H_2O)_k \qquad (1)$$

wherein X independently represents Li, Na, K, Rb, Cs or quaternary ammonium and i, j and k independently represent numbers which satisfy $0<i\leqq 1$, $0<j\leqq 1$ and $0\leqq k\leqq 2$.

12. The composition for forming a porous film according to claim 11, wherein said silicate is tetramethylammonium silicate.

* * * * *